(12) United States Patent
Stauss et al.

(10) Patent No.: US 8,173,991 B2
(45) Date of Patent: May 8, 2012

(54) OPTOELECTRONIC SEMICONDUCTOR CHIP HAVING A MULTIPLE QUANTUM WELL STRUCTURE

(75) Inventors: Peter Stauss, Pettendorf (DE); Matthias Peter, Alteglofsheim (DE); Alexander Walter, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 43 days.

(21) Appl. No.: 12/680,463

(22) PCT Filed: Sep. 12, 2008

(86) PCT No.: PCT/DE2008/001534
§ 371 (c)(1),
(2), (4) Date: Sep. 22, 2010

(87) PCT Pub. No.: WO2009/039830
PCT Pub. Date: Apr. 2, 2009

(65) Prior Publication Data
US 2011/0042643 A1 Feb. 24, 2011

(30) Foreign Application Priority Data
Sep. 26, 2007 (DE) .......................... 10 2007 046 027

(51) Int. Cl.
H01L 21/20 (2006.01)
H01L 21/02 (2006.01)
H01L 33/00 (2010.01)
(52) U.S. Cl. ............... 257/15; 257/257; 257/79; 257/99; 257/613; 257/615; 257/103; 257/E21.125; 438/40; 438/45; 438/504; 438/506
(58) Field of Classification Search ............ 257/15, 257/103, 257, 613, 615, 79, 99, E21.125; 438/40, 45, 504, 506
See application file for complete search history.

(56) References Cited

U.S. PATENT DOCUMENTS
5,475,701 A * 12/1995 Hibbs-Brenner ........ 372/50.124
(Continued)

FOREIGN PATENT DOCUMENTS
DE 10 2005 016 592 11/2005
(Continued)

OTHER PUBLICATIONS
I. Schnitzer, "30% external quantum efficiency from surface textured, thin-film light-emitting diodes", Appl. Phys. Lett., vol. 63, No. 16, pp. 2174-2176, Oct. 18, 1993.

Primary Examiner — Zandra Smith
Assistant Examiner — Tsz Chiu
(74) Attorney, Agent, or Firm — Cozen O'Connor

(57) ABSTRACT

An optoelectronic semiconductor chip is specified, which has an active zone (20) containing a multi quantum well structure provided for generating electromagnetic radiation, which comprises a plurality of successive quantum well layers (210, 220, 230). The multi quantum well structure comprises at least one first quantum well layer (210), which is n-conductively doped and which is arranged between two n-conductively doped barrier layers (250) adjoining the first quantum well layer. It comprises a second quantum well layer (220), which is undoped and is arranged between two barrier layers (250, 260) adjoining the second quantum well layer, of which one is n-conductively doped and the other is undoped. In addition, the multi quantum well structure comprises at least one third quantum well layer (230), which is undoped and which is arranged between two undoped barrier layers (260) adjoining the third quantum well layer.

13 Claims, 3 Drawing Sheets

U.S. PATENT DOCUMENTS

| | | | |
|---|---|---|---|
| 5,577,064 A * | 11/1996 | Swirhun et al. | 372/96 |
| 5,757,837 A * | 5/1998 | Lim et al. | 372/50.21 |
| 5,831,277 A * | 11/1998 | Razeghi | 257/15 |
| 6,064,683 A * | 5/2000 | Johnson | 372/46.015 |
| 6,111,272 A | 8/2000 | Heinen | |
| 6,121,634 A | 9/2000 | Saito et al. | |
| 6,153,894 A * | 11/2000 | Udagawa | 257/96 |
| 6,608,330 B1 * | 8/2003 | Yamada | 257/90 |
| 6,657,234 B1 * | 12/2003 | Tanizawa | 257/79 |
| 6,849,866 B2 * | 2/2005 | Taylor | 257/24 |
| 6,849,881 B1 | 2/2005 | Harle et al. | |
| 6,936,838 B2 | 8/2005 | Kim | |
| 7,054,345 B2 * | 5/2006 | Ryou et al. | 372/45.01 |
| 7,184,455 B2 * | 2/2007 | Guenter et al. | 372/50.21 |
| 7,277,461 B2 * | 10/2007 | Ryou et al. | 372/46.01 |
| 7,366,217 B2 * | 4/2008 | Guenter et al. | 372/50.21 |
| 2002/0017652 A1 | 2/2002 | Illek et al. | |
| 2003/0173560 A1 * | 9/2003 | Kano et al. | 257/15 |
| 2003/0205736 A1 | 11/2003 | Kozaki | |
| 2004/0031978 A1 | 2/2004 | Evelyn et al. | |
| 2005/0116216 A1 * | 6/2005 | Harle et al. | 257/14 |
| 2005/0156153 A1 | 7/2005 | Futagawa | |
| 2006/0043356 A1 | 3/2006 | Kimura | |
| 2006/0175600 A1 * | 8/2006 | Sato et al. | 257/14 |
| 2008/0142780 A1 | 6/2008 | Bader et al. | |

FOREIGN PATENT DOCUMENTS

| | | |
|---|---|---|
| EP | 0 905 797 | 8/1998 |
| EP | 1 189 289 | 6/2000 |
| EP | 1 076 390 | 2/2001 |
| EP | 1 401 027 | 5/2002 |
| EP | 1 385 241 | 1/2004 |
| EP | 1 564 854 | 8/2005 |
| WO | WO 01/39282 | 5/2001 |
| WO | WO 02/13281 | 2/2002 |

* cited by examiner

US 8,173,991 B2

OPTOELECTRONIC SEMICONDUCTOR CHIP HAVING A MULTIPLE QUANTUM WELL STRUCTURE

RELATED APPLICATIONS

This is a U.S. national stage of application No. PCT/DE2008/001534, filed on Sep. 12, 2008.

This application claims the priority from German patent application no. 10 2007 046 027.0filed Sep. 26, 2007, the content of which is hereby incorporated by reference.

FIELD OF THE INVENTION

The present application relates to an optoelectronic semiconductor chip with a multi quantum well structure.

BACKGROUND OF THE INVENTION

Optoelectronic semiconductor chips with a multi quantum well structure are disclosed for example in documents WO 01/39282 A2 and U.S. Pat. No. 5,831,277.

SUMMARY OF THE INVENTION

It is an object of the present application to provide a particularly efficient optoelectronic semiconductor chip with a multi quantum well structure.

This and other objects are attained in accordance with one aspect of the present invention directed to an opto electronic semiconductor chip with an active zone, the active zone containing a multi quantum well structure provided for generating electromagnetic radiation, which contains a plurality of successive quantum well layers, the multi quantum well structure comprising at least one first quantum well layer, which is n-conductively doped and which is arranged between two n-conductively doped barrier layers adjoining the first quantum well layer; a second quantum well layer, which is undoped and which is arranged between two barrier layers adjoining the second quantum well layer, of which one is n-conductively doped and the other is undoped; and at least one third quantum well layer, which is undoped and which is arranged between two undoped barrier layers adjoining the third quantum well layer.

One embodiment of an optoelectronic semiconductor chip comprises an active zone containing a multi quantum well structure provided for generating electromagnetic radiation. The active zone is in particular a sub-region of an epitaxial semiconductor layer sequence. The semiconductor chip is, for example, a light-emitting diode chip or a laser diode chip.

The active zone contains a plurality of successive quantum well layers. Expediently, each quantum well layer is arranged between two barrier layers associated therewith. In other words a barrier layer and a quantum well layer in each case succeed one another in the active zone. Each quantum well layer is in particular preceded by a barrier layer associated therewith and succeeded by a further barrier layer associated therewith. The terms "preceded" and "succeeded" should be understood in the present context in each case as relating to the direction extending from an n-side to a p-side of the semiconductor chip, between which sides the active zone is arranged.

The terms "multi quantum well structure" and "quantum well layer" do not here have any significance regarding quantisation dimensions. The quantum well defined by a quantum well layer and the two barrier layers associated therewith may represent a quantum film, at least one quantum wire or at least one quantum dot or a combination of at least two of these structures.

The multi quantum well structure comprises at least one first quantum well layer, which is n-conductively doped and which is arranged between two n-conductively doped barrier layers adjoining the first quantum well layer. In other words, in particular both the first quantum well layer and the two barrier layers associated therewith are n-conductively doped.

An n-conductively doped layer should be understood in the present context to mean a layer doped with at least one n-dopant such as silicon. It is feasible for two different layers, for instance a quantum well layer and a barrier layer, to be n-conductively doped with different n-dopants. Preferably, all the n-conductively doped quantum well and barrier layers are doped with the same n-dopant or with the same n-dopants.

The multi quantum well structure further comprises at least one, preferably precisely one second quantum well layer, which is undoped and which is arranged between two barrier layers adjoining the second quantum well layer, of which one is n-conductively doped and the other is undoped. For example the second quantum well layer succeeds the first quantum well layer. In particular, the barrier layer preceding the second quantum well layer is n-conductively doped and the barrier layer succeeding the second quantum well layer is undoped.

An undoped layer should here be understood to mean a layer which is substantially free of an n-dopant or p-dopant. An undoped layer may however—for example because of diffusion of an n- and/or p-dopant—also have a small concentration, in particular a tiny concentration, of the n- and/or p-dopant. An n-dopant is present in a small concentration in the undoped layer in particular if its concentration in the undoped layer is at least 40 percent less, preferably at least 70 percent less, than the concentration of the n-dopant in the first quantum well layer.

Finally, the multi quantum well structure has at least one third quantum well layer, which is undoped and is arranged between two likewise undoped barrier layers adjoining the third quantum well layer. Expediently, the third quantum well layer is arranged successive to the second quantum well layer in the active zone.

The inventors have established that, by means of such a sequence of first, second and third quantum well layers, a particularly high efficiency is achieved for the semiconductor chip. In particular, efficiency is increased over conventional semiconductor chips at high operating currents. The optoelectronic semiconductor chip is intended for example for operation with an operating current of greater than or equal to 80 mA.

In one configuration, the multi quantum well structure comprises at least one fourth quantum well layer, which is undoped and is arranged between two n-conductively doped barrier layers adjoining the fourth quantum well layer. For example, the fourth quantum well layer succeeds the at least one first quantum well layer and precedes the second quantum well layer.

The semiconductor chip with the fourth quantum well layer advantageously comprises a particularly low forward voltage. In other words, a predetermined operating current is achieved with a particularly low operating voltage. The semiconductor chip with at least one fourth quantum well layer is intended for example for operation with a low operating current, for instance with an operating current of approx. 20 mA.

In one configuration, the multi quantum well structure contains at least as many first as third quantum well layers. In a further development it contains more first than third quantum well layers. The inventors have established from extensive comparative tests that the semiconductor chip is particularly efficient when the number of first quantum well layers is greater than or equal to the number of third quantum well layers.

In a further configuration, the active zone comprises at most ten quantum well layers. Preferably it comprises five or more quantum well layers. The semiconductor chip particularly preferably comprises between seven and nine quantum well layers, the limit values being included. Tests carried out by the inventors have shown that such a semiconductor chip generates a particularly high luminous flux with a predetermined operating current. In particular, saturation behaviour of the luminous flux is particularly slight with an increasing operating current.

In one configuration, the active zone is preceded in the direction extending from the n-side to the p-side of the semiconductor chip by a superlattice of pairs of alternating layers. The superlattice extends for example over a layer thickness of less than or equal to 50 nm, in particular of less than or equal to 30 nm. For example it has a layer thickness of approx. 25 nm.

The alternating layers of the superlattice have for example a layer thickness of less than or equal to 5 nm, in particular they have a layer thickness of approx. 0.5 to 2 nm, the limit values being included. At least one layer of each pair of alternating layers is n-conductively doped. In one configuration, the entire superlattice is n-conductively doped.

The small layer thickness of the superlattice of 50 nm or less allows a particularly low forward voltage to be achieved for the semiconductor chip. By means of the n-conductively doped, first quantum well layer(s), good charge carrier injection into the at least one third quantum well layer is achieved even with the small layer thickness of the superlattice.

The first quantum well layer, the two barrier layers adjoining the first quantum well layer and/or the n-conductively doped barrier layer adjoining the second quantum well layer is/are doped with an n-dopant in particular in a concentration of greater than or equal to $1 \times 10^{18}$ atoms/cm$^3$. In one configuration, the first quantum well layer and the two barrier layers adjoining the first quantum well layer comprise the same n-dopant in the same concentration. Alternatively or in addition, in a further development the n-conductively doped barrier layer adjoining the second quantum well layer comprises the n-dopant in the same concentration as the first quantum well layer and/or as the barrier layers adjoining the first quantum well layer. Two layers here comprise the n-dopant "in the same concentration", if the concentration of the n-dopant between the layers differs by 20 percent or less, preferably by 10 percent or less, for example by 5 percent or less.

The barrier layers have for example a layer thickness of between 5 and 12 nm, preferably between 6 and 11 nm, particularly preferably between 9 and 10.5 nm, the limit values in each case being included. In a further development the quantum well layers have for example a layer thickness of between 1 and 5 nanometers, preferably between 2 and 3 nm, the limit values in each case being included. By way of example, the layer thickness of the barrier layers amounts to approx. 10 nm and the layer thickness of the quantum well layers amounts to approx. 2.5 nm. Comparative tests carried out by the inventors have shown that, with such layer thicknesses for the barrier layers and/or the quantum well layers, the semiconductor chip exhibits particularly low saturation of the luminous flux with an increasing operating current.

In a further configuration the semiconductor chip is free of a growth substrate. The semiconductor chip is in particular a thin-film semiconductor chip.

A thin-film semiconductor chip is distinguished in particular by at least one of the following characteristic features:
  a reflective layer is applied to or formed on a first main face, facing a support element, of the radiation-generating, epitaxial semiconductor layer sequence, said reflective layer reflecting at least some of the electromagnetic radiation generated in the epitaxial semiconductor layer sequence back into it;
  the thin-film semiconductor chip includes a support element, which is not the growth substrate on which the semiconductor layer sequence was grown epitaxially but rather is a separate support element, which was attached subsequently to the epitaxial semiconductor layer sequence,
  the growth substrate of the epitaxial semiconductor layer sequence is removed from the epitaxial semiconductor layer sequence or thinned in such a way that it is not self-supporting together with the epitaxial semiconductor layer sequence alone, or
  the epitaxial semiconductor layer sequence has a thickness in the range of 20 μm or less, in particular in the range of 10 μm.

The support element is preferably permeable to radiation emitted by the semiconductor chip.

In addition, the epitaxial semiconductor layer sequence preferably contains at least one semiconductor layer with at least one face which comprises an intermixing structure, which ideally leads to an approximately ergodic distribution of the light in the epitaxial semiconductor layer sequence, i.e. it exhibits scattering behaviour which is as ergodically stochastic as possible.

The basic principle of a thin-film semiconductor chip is described for example in I. Schnitzer et al., Appl. Phys. Lett. 63 (16), 18 Oct. 1993, 2174-2176, whose disclosure content in this respect is hereby incorporated by reference. Examples of thin-film semiconductor chips are described in the documents EP 0905797 A2 and WO 02/13281 A1, whose disclosure content in this respect is hereby incorporated by reference.

In a good approximation, a thin-film semiconductor chip is a Lambertian surface emitter and is therefore suitable in particular for application in a headlight.

The active zone of the semiconductor chip, in particular the epitaxial semiconductor layer sequence of the semiconductor chip is based, in one configuration, on a III-V compound semiconductor material, for instance a nitride compound semiconductor material such as InAlGaN. In another embodiment the semiconductor layer sequence is based on a II-VI compound semiconductor material.

A III-V compound semiconductor material comprises at least one element from the third main group, such as for example Al, Ga, In, and one element from the fifth main group, such as for example B, N, P, As. In particular, the term "III-V compound semiconductor material" encompasses the group of binary, ternary or quaternary compounds, which contain at least one element from the third main group and at least one element from the fifth main group, for example nitride and phosphide compound semiconductors. Such a binary, ternary or quaternary compound may moreover comprise for example one or more dopants and additional constituents.

Accordingly, a II-VI compound semiconductor material comprises at least one element from the second main group, such as for example Be, Mg, Ca, Sr, and one element from the sixth main group, such as for example O, S, Se. In particular, a II-VI compound semiconductor material comprises a binary, ternary or quaternary compound, which comprises at least one element from the second main group and at least one element from the sixth main group. Such a binary, ternary or quaternary compound may moreover comprise for example one or more dopants and additional constituents. The II-VI compound semiconductor materials for example include: ZnO, ZnMgO, CdS, ZnCdS, MgBeO.

"Based on nitride compound semiconductor material" means in the present context that the semiconductor layer sequence or at least part thereof, particularly preferably at least the active zone and/or the growth substrate, comprises a nitride compound semiconductor material, preferably $In_nAl_mGa_{1-n-m}N$ or consists thereof, wherein $0 \leq n \leq 1$, $0 \leq m \leq 1$ and $n+m \leq 1$. This material does not absolutely have to exhibit a mathematically exact composition according to the above formula. Instead, it may for example comprise one or more dopants and additional constituents. For simplicity's sake, however, the above formula includes only the fundamental constituents of the crystal lattice (Al, Ga, In, N), even if these may in part be replaced and/or supplemented by small quantities of further substances.

In one configuration, the semiconductor chip is intended for the emission of electromagnetic radiation with a maximum intensity in the green range of the spectrum.

DETAILED DESCRIPTION OF THE DRAWINGS

Figure 1:
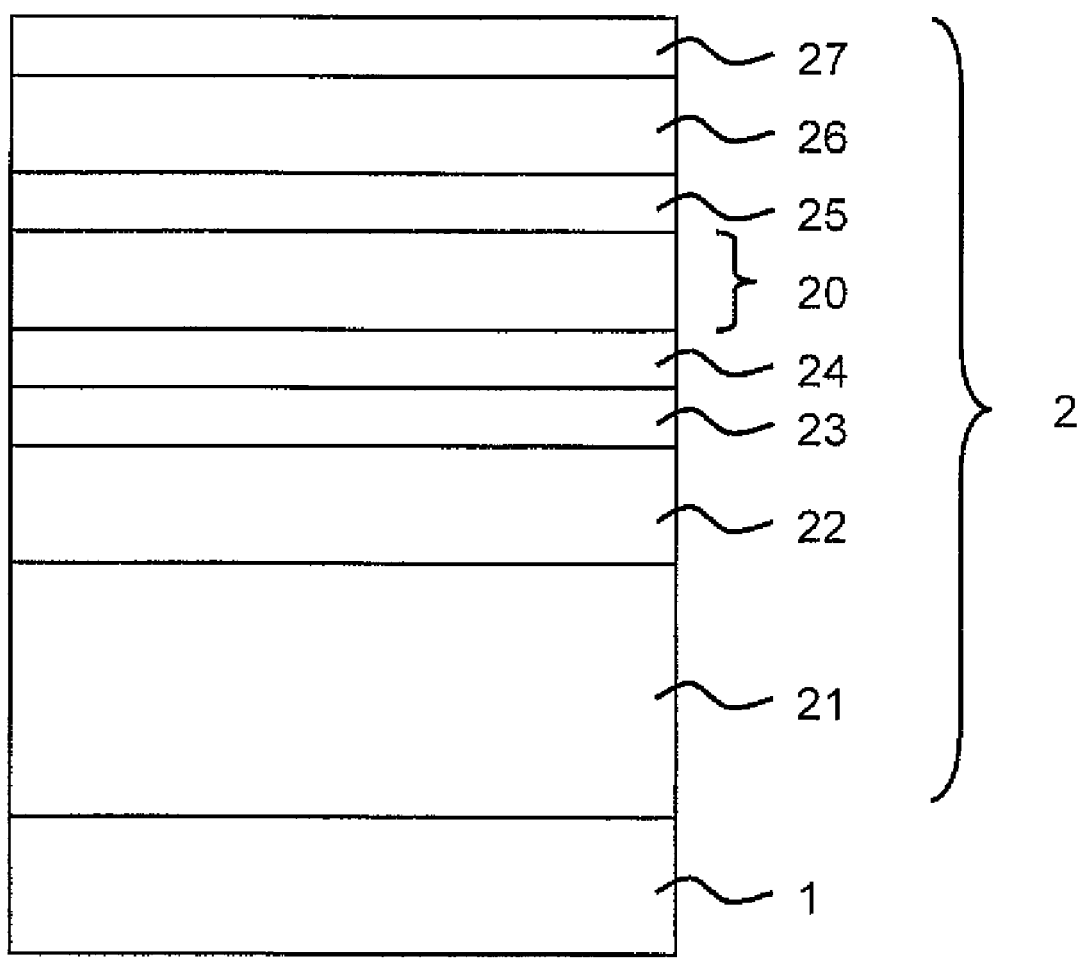
FIG. 1 shows a schematic cross-section through an optoelectronic semiconductor chip according to a first exemplary embodiment.

In the figures and exemplary embodiments, identical or identically acting components are in each case provided with the same reference numerals. The figures and the size ratios of the elements illustrated in the figures relative to one another are fundamentally not to be regarded as being to scale. Rather, individual elements may be illustrated in an exaggerated fashion for better comprehension and/or greater ease of depiction. For example, layers may be exaggeratedly large and/or concentration differences may be exaggeratedly large or exaggeratedly small.

FIG. 1 shows a schematic cross-section through an optoelectronic semiconductor chip according to a first exemplary embodiment. The optoelectronic semiconductor chip comprises an epitaxial semiconductor layer sequence 2 on a growth substrate 1. In one variant of the semiconductor chip the growth substrate 1 is removed or at least greatly thinned.

The semiconductor layer sequence 2 is based for example on an InAlGaN compound semiconductor material. It is produced for example on a growth substrate 1, which comprises or consists of sapphire.

The semiconductor layer sequence 2 contains at least one n-contact layer 21 and one p-contact layer 27 between which an active zone 20 is arranged which contains a multi quantum well structure for generating radiation.

In the course from the n-contact layer 21 to the active zone 20 the semiconductor layer sequence 2 here comprises a current spreading layer 22 and two further n-doped layers 23, 24. In the course from the active zone 20 to the p-contact layer 27 the semiconductor layer sequence 2 here comprises two further p-doped layers 25, 26. The further n-doped and/or p-doped layers, or at least one or some of these layers, are for example charge carrier confinement layers.

The n-contact layer 21 here has a layer thickness of 3 μm. The n-contact layer 21 comprises GaN, for example. It is preferably n-conductively doped with silicon as n-dopant, for instance with a concentration of $3 \times 10^{18}$ atoms/cm³.

The current spreading layer 22 has a layer thickness of 1 μm, for example. It is conveniently highly n-doped, for example with silicon in a concentration of $1 \times 10^{19}$ atoms/cm³. In this way, it exhibits high electrical transverse conductivity.

The two further n-doped layers here have in each case a layer thickness of 0.5 μm. For example they both comprise gallium nitride n-conductively doped with silicon as the n-dopant. The silicon concentration amounts for example in the further n-doped layer 24 facing the active zone 20 to $8 \times 10^{17}$ atoms/cm³. In the further n-doped layer remote from the active zone 20, the silicon is present for example in a concentration of $1 \times 10^{18}$ atoms/cm³.

The p-contact layer 27 contains GaN for example. The further p-doped layers 25, 26 contain AlGaN for example. The further p-doped layer 25 facing the active zone 20 is here an AlGaN (10% Al) layer and the further p-doped layer 26 remote from the active zone 20 is here an AlGaN (6% Al) layer. The p-contact layer and the further p-doped layers 25, 26 are doped for example with magnesium as the p-dopant.

In the p-contact layer 27 the concentration of the p-dopant is here less than in the further p-conductive layers 25, 26. For example, in the p-contact layer 27 it amounts to approx. $5 \times 10^{19}$ atoms/cm³. In the further p-doped layers 25, 26 the p-dopant is present for example in a concentration of greater than or equal to $6 \times 10^{19}$ atoms/cm³, for example in a concentration of approx. $1 \times 10^{20}$ atoms/cm³.

Figure 2:
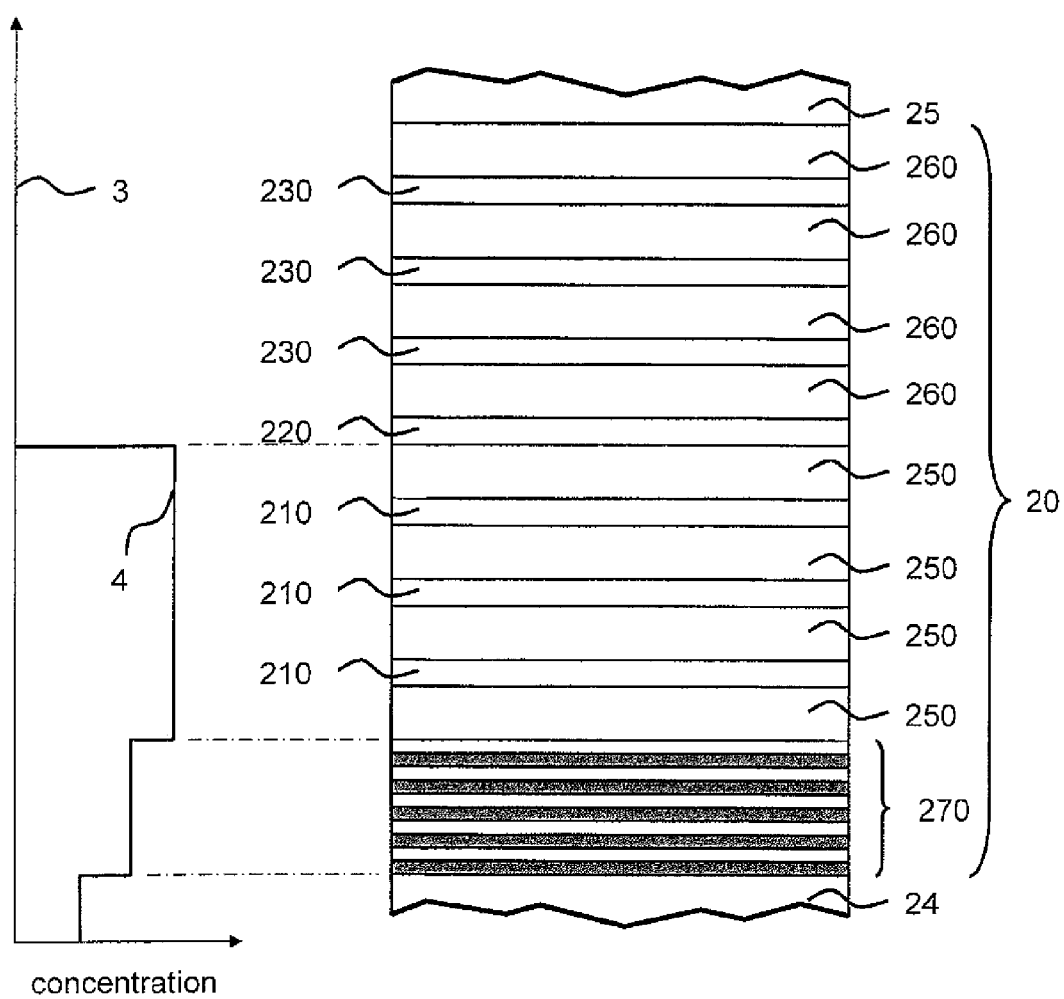
FIG. 2 shows a schematic cross-section through the active zone of the optoelectronic semiconductor chip according to the first exemplary embodiment and a schematic concentration profile of an n-dopant in the active zone.

FIG. 2 shows the active zone 20 of the semiconductor layer sequence 2 on an enlarged scale. In the right-hand region of FIG. 2 the active zone 20 is shown in schematic cross-section. The left hand region of FIG. 2 shows a schematic diagram of the concentration 4 of the n-dopant of the layers depicted in the right-hand region. The arrow 3 denotes the direction from an n-side to a p-side of the semiconductor layer sequence 2 between which the active zone 20 is arranged, i.e. in particular the direction from the n-contact layer 21 to the p-contact layer 27.

The active zone 20 of the semiconductor chip according to the first exemplary embodiment comprises a quantum well structure with seven quantum well layers 210, 220, 230. In the direction 3 from the n- to the p-side, three first quantum well layers 210, one second quantum well layer 220 and three third quantum well layers 230 succeed one another.

Two adjacent quantum well layers 210, 220, 230 are in each case separated from one another by a barrier layer 250, 260. One of the barrier layers 250 precedes the first of the first quantum well layers 210. A further one of the barrier layers 260 succeeds the last of the third quantum well layers 230. In this way each of the quantum well layers 210, 220, 230 is arranged between precisely two barrier layers 250, 260.

The quantum well layers 210, 220, 230 and the barrier layers 250, 260 are preceded by a superlattice structure 270. The superlattice structure 270 consists of pairs of alternating InGaN and GaN layers, which in each case have a layer thickness of less than or equal to 1 nm, for example. They are doped for example with a concentration of $1.5 \times 10^{18}$ atoms/cm³ with silicon as n-dopant.

The three first quantum well layers 210 succeeding the superlattice structure 270 and the barrier layers 250 associated therewith, between which the first quantum well layers 210 are arranged, are likewise doped with silicon as the n-dopant, for example in a concentration of between $1 \times 10^{18}$ atoms/cm$^3$ and $8 \times 10^{18}$ atoms/cm$^3$, in particular between $2 \times 10^{18}$ and $4 \times 10^{18}$ atoms/cm$^3$, the limit values in each case being included.

The first quantum well layers 210 are followed by the second quantum well layer 220, which is preceded by a barrier layer 250, which is also associated with a first quantum well layer 210. The barrier layer 250 preceding the second quantum well layer 220 is n-doped. The barrier layer 260 succeeding the second quantum well layer 220 is undoped, as is the second quantum well layer 220 itself.

The second quantum well layer 220 is succeeded by three third quantum well layers 230 each between two undoped barrier layers 260.

The semiconductor chip is intended for operation with an operating current of for example 80 mA. A large part of, in particular virtually all the electromagnetic radiation emitted by the semiconductor chip is generated in at least one, preferably a plurality, in particular all, of the third quantum well layers 230 or in the third quantum well layers 230 and the second quantum well layer 220. The first quantum well layers 210 do not or barely contribute to radiation generation.

Figure 3:
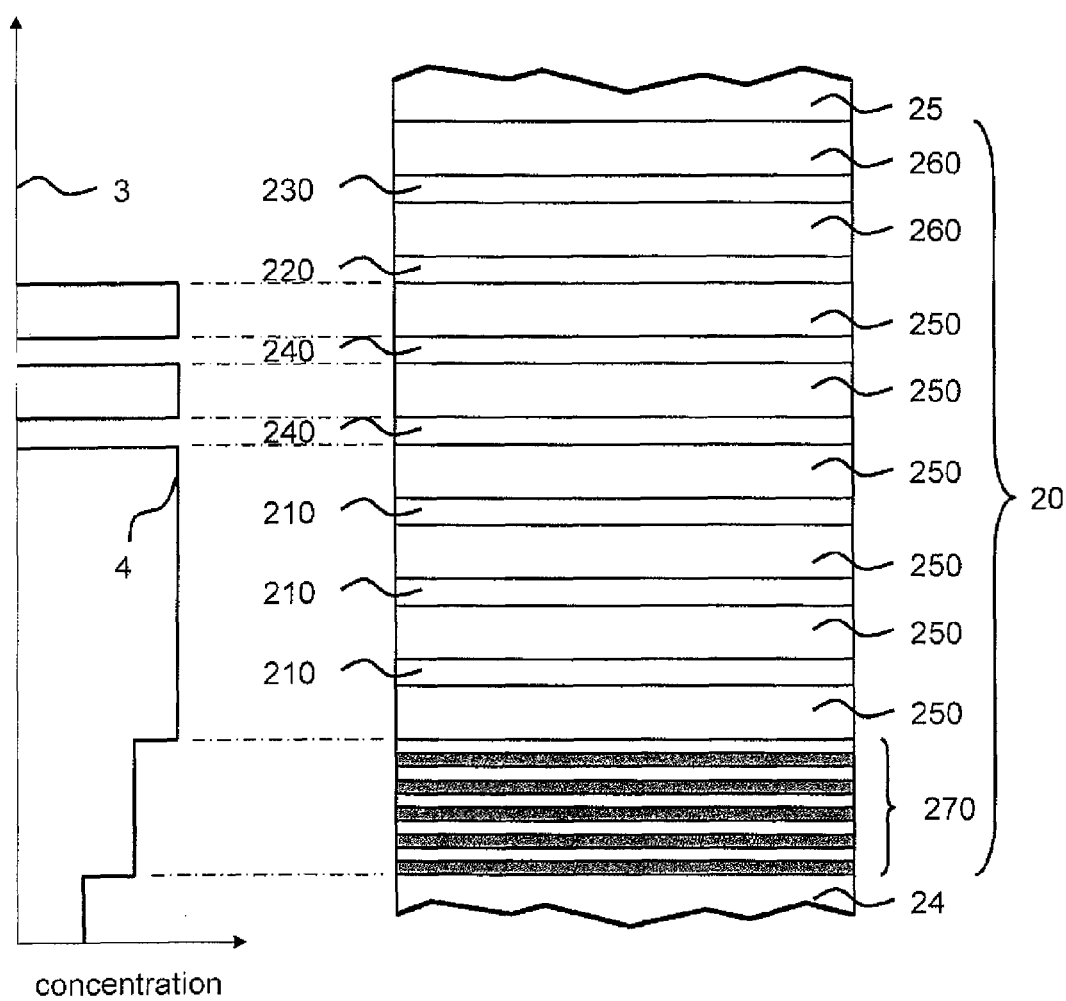
FIG. 3 shows a schematic cross-section through the active zone of an optoelectronic semiconductor chip according to a second exemplary embodiment and the concentration profile of an n-dopant in the active zone.

FIG. 3 is a schematic cross-section of the active zone 20 of a semiconductor chip according to a second exemplary embodiment. The left-hand region again shows schematically the concentration profile of the n-dopant of the layers shown in the right-hand region.

The semiconductor chip according to the second exemplary embodiment differs from that of the first exemplary embodiment in that the active zone 20 merely contains a single third quantum well layer 230. In addition, it contains two fourth quantum well layers 240, which succeed the first quantum well layers 210 and precede the second quantum well layer 220. All in all, therefore, the active zone 20 in the second exemplary embodiment also contains seven quantum well layers 210, 220, 230, 240.

The fourth quantum well layers 240 are undoped. Each of the fourth quantum well layers 240 is arranged between two adjacent barrier layers 250 doped with the n-dopant. The n-dopant here has the same concentration in all the barrier layers 250 doped with the n-dopant and in the first quantum well layers 210.

The semiconductor chip according to the second exemplary embodiment is intended in particular for operation with an operating current of for instance 20 mA.

The description made with reference to the exemplary embodiments does not restrict the invention to these embodiments. Rather, the invention encompasses any novel feature and any combination of features, including in particular any combination of features in the exemplary embodiments and claims, even if this feature or this combination is not itself explicitly indicated in the exemplary embodiments or claims.

The invention claimed is:

1. An optoelectronic semiconductor chip with an active zone, the active zone containing a multi quantum well structure provided for generating electromagnetic radiation, which contains a plurality of successive quantum well layers, the multi quantum well structure comprising:

at least one first quantum well layer, which is n-conductively doped and which is arranged between two n-conductively doped barrier layers adjoining the first quantum well layer;

a second quantum well layer, which is undoped and which is arranged between two barrier layers adjoining the second quantum well layer, of which one is n-conductively doped and the other is undoped; and at least one third quantum well layer, which is undoped and which is arranged between two undoped barrier layers adjoining the third quantum well layer.

2. The optoelectronic semiconductor chip according to claim 1, wherein the at least one first, the second and the at least one third quantum well layer succeed one another in this sequence in the direction extending from an n-side to a p-side of the semiconductor chip.

3. The optoelectronic semiconductor chip according to claim 1, wherein the multi quantum well structure comprises at least one fourth quantum well layer, which is undoped and is arranged between two n-conductively doped barrier layers adjoining the fourth quantum well layer.

4. The optoelectronic semiconductor chip according to claim 1, which contains exactly the same number of first as third quantum well layers or more first than third quantum well layers.

5. The optoelectronic semiconductor chip according to claim 1, wherein the active zone comprises at most ten quantum well layers.

6. The optoelectronic semiconductor chip according to claim 1, which comprises a superlattice of pairs of alternating layers preceding the active zone in the direction from an n-side to a p-side of the semiconductor chip, which superlattice has a thickness of less than or equal to 50 nm.

7. The optoelectronic semiconductor chip according to claim 6, wherein at least one layer of each pair of alternating layers is n-conductively doped.

8. The optoelectronic semiconductor chip according to claim 1, wherein the at least one first quantum well layer and/or the two barrier layers adjoining the first quantum well layer contain an n-dopant in a concentration of greater than or equal to $1 \times 10^{18}$ atoms/cm$^3$.

9. The optoelectronic semiconductor chip according to claim 1, wherein the layer thickness of the barrier layers in each case has a value of between 9.5 nm and 10.5 nm, the limit values being included.

10. The optoelectronic semiconductor chip according to claim 1, wherein the layer thickness of the quantum well layers in each case has a value of between 2 nm and 3 nm, the limit values being included.

11. The optoelectronic semiconductor chip according to claim 1, which is free of a growth substrate.

12. The optoelectronic semiconductor chip according to claim 1, wherein the active zone is based on an InGaN compound semiconductor material.

13. The optoelectronic semiconductor chip according to claim 1, which is provided for the emission of electromagnetic radiation with an intensity maximum in the green spectral range.

* * * * *